United States Patent
Han (10) Patent No.: US 9,836,100 B2
(45) Date of Patent: Dec. 5, 2017

(54) SUPPORT FRAME WITH INTEGRATED PHASE CHANGE MATERIAL FOR THERMAL MANAGEMENT

(71) Applicant: Futurewei Technologies, Inc., Plano, TX (US)

(72) Inventor: Qian Han, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 361 days.

(21) Appl. No.: 14/515,138

(22) Filed: Oct. 15, 2014

(65) Prior Publication Data

US 2016/0109911 A1 Apr. 21, 2016

(51) Int. Cl.
| | | |
|---|---|---|
| G06F 1/20 | (2006.01) |
| H05K 7/20 | (2006.01) |
| H05K 9/00 | (2006.01) |
| H01L 23/427 | (2006.01) |
| G03B 17/55 | (2006.01) |
| G03B 15/05 | (2006.01) |

(52) U.S. Cl.
CPC ............. *G06F 1/203* (2013.01); *G03B 17/55* (2013.01); *H01L 23/427* (2013.01); *H01L 23/4275* (2013.01); *H05K 7/2029* (2013.01); *H05K 7/20509* (2013.01); *H05K 9/0024* (2013.01); *G03B 15/05* (2013.01)

(58) Field of Classification Search
CPC .............................................. G06F 1/20–1/206
See application file for complete search history.

(56) References Cited

U.S. PATENT DOCUMENTS

| | | | | |
|---|---|---|---|---|
| 6,104,611 A * | 8/2000 | Glover | ................... | F28D 15/06 165/104.33 |
| 6,418,017 B1 * | 7/2002 | Patel | ....................... | G06F 1/203 165/104.33 |
| 6,785,135 B2 * | 8/2004 | Ohmi | ................... | F28D 15/0233 165/104.26 |

(Continued)

FOREIGN PATENT DOCUMENTS

| | | |
|---|---|---|
| CN | 1856236 | 11/2006 |
| CN | 102438423 | 5/2012 |

(Continued)

OTHER PUBLICATIONS

"International Application No. PCT/CN2015/091940, International Search Report dated Jan. 21, 2016", (Jan. 21, 2016), 12 pgs.

(Continued)

*Primary Examiner* — Robert J Hoffberg
(74) *Attorney, Agent, or Firm* — Schwegman Lundberg & Woessner, P.A.

(57) ABSTRACT

The invention is directed to a novel solution to providing heat management and cooling to electronic devices. According to various embodiments, heat produced during the operation of the processing components in the computing device is absorbed by heat management features integrated within a supporting mid-frame. The heat management features include phase changing materials that allow the processing components to be kept at a isothermal state through changes in phase, thereby prolonging the duration of time in which the processing components can operate at high performance levels without the need to throttle the performance.

18 Claims, 8 Drawing Sheets

(56) References Cited

U.S. PATENT DOCUMENTS

| | | | | |
|---|---|---|---|---|
| 6,788,537 | B2* | 9/2004 | Saita | F28D 15/0233 165/104.33 |
| 6,914,782 | B2* | 7/2005 | Ku | G06F 1/203 165/80.3 |
| 7,064,956 | B2* | 6/2006 | Patel | H05K 7/20 353/54 |
| 7,880,686 | B2* | 2/2011 | Yokodate | H04M 1/22 345/1.1 |
| 7,924,565 | B2* | 4/2011 | Huang | H05K 7/20336 165/185 |
| 7,999,196 | B2* | 8/2011 | Hsieh | H05K 7/20509 174/386 |
| 8,391,010 | B2* | 3/2013 | Rothkopf | G06F 1/1626 313/46 |
| 8,934,235 | B2* | 1/2015 | Rubenstein | G06F 1/206 165/185 |
| 9,007,769 | B2* | 4/2015 | Cheng | G06F 1/1626 257/76 |
| 9,007,770 | B2* | 4/2015 | Cheng | G06F 1/203 257/76 |
| 9,013,875 | B2* | 4/2015 | Cheng | G06F 1/203 257/76 |
| 9,013,876 | B2* | 4/2015 | Cheng | G06F 1/203 257/76 |
| 9,049,801 | B2* | 6/2015 | Rothkopf | G06F 1/1626 |
| 9,307,682 | B2* | 4/2016 | Fujieda | G06F 1/203 |
| 9,310,139 | B2* | 4/2016 | Vadakkanmaruveedu | F28D 15/02 |
| 9,535,470 | B2* | 1/2017 | Wu | G06F 1/203 |
| 9,547,344 | B2* | 1/2017 | Han | G06F 1/203 |
| 9,568,255 | B2* | 2/2017 | Tan | F28D 15/0275 |
| 9,625,215 | B2* | 4/2017 | Hsiao | G06F 1/20 |
| 2001/0022219 | A1* | 9/2001 | Ikeda | F28D 15/0233 165/46 |
| 2004/0112572 | A1* | 6/2004 | Moon | F28D 15/0233 165/104.21 |
| 2004/0252454 | A1* | 12/2004 | Chen | G06F 1/203 361/679.54 |
| 2005/0280987 | A1 | 12/2005 | Kwitek et al. | |
| 2006/0157228 | A1* | 7/2006 | Moon | F28D 15/0233 165/104.21 |
| 2007/0130769 | A1* | 6/2007 | Moon | B21C 23/085 29/890.032 |
| 2009/0188110 | A1* | 7/2009 | Moon | B21C 23/085 29/890.032 |
| 2012/0044635 | A1 | 2/2012 | Rothkopf et al. | |
| 2012/0085520 | A1* | 4/2012 | Pfaffinger | H01L 23/427 165/104.26 |
| 2012/0307452 | A1* | 12/2012 | Yan | G06F 1/20 361/700 |
| 2013/0186598 | A1* | 7/2013 | Rubenstein | G06F 1/20 165/104.21 |
| 2014/0262160 | A1* | 9/2014 | Vadakkanmaruveedu | F28D 15/02 165/104.33 |
| 2014/0352926 | A1* | 12/2014 | Sun | G06F 1/203 165/104.26 |
| 2015/0237762 | A1* | 8/2015 | Holt | H05K 7/20336 165/104.21 |
| 2015/0253823 | A1* | 9/2015 | Han | G06F 1/203 361/679.52 |
| 2015/0300750 | A1* | 10/2015 | Tan | F28D 15/0275 361/679.52 |
| 2016/0007504 | A1* | 1/2016 | Wu | G06F 1/203 361/700 |
| 2016/0088762 | A1* | 3/2016 | Wu | H05K 7/20336 361/700 |
| 2016/0088769 | A1* | 3/2016 | Hsiao | G06F 1/20 361/700 |
| 2016/0135331 | A1* | 5/2016 | Wu | G06F 3/041 361/700 |
| 2016/0135336 | A1* | 5/2016 | Wu | H05K 9/0049 361/714 |
| 2017/0075396 | A1* | 3/2017 | Damaraju | G06F 1/203 |

FOREIGN PATENT DOCUMENTS

| | | | | |
|---|---|---|---|---|
| CN | 103209574 | | 7/2013 | |
| WO | WO 2016053966 | A2 * | 4/2016 | H05K 7/20454 |

OTHER PUBLICATIONS

Kandasamy, Ravi, et al., "Transient cooling of electronics using phase change material (PCM)-based heat sinks", Applied Thermal Engineering 28 (2008) 1047-1057, (Jun. 24, 2007), 1047-1057.

* cited by examiner

SUPPORT FRAME WITH INTEGRATED PHASE CHANGE MATERIAL FOR THERMAL MANAGEMENT

BACKGROUND OF THE INVENTION

The prevailing design methodology of mobile computing devices (such as smart phones, tablets devices, netbooks, personal data assistants, portable media devices, wearable devices, etc.) emphasizes slimmer profiles while offering ever increasing processing and image rendering capabilities and larger display sizes. As a natural result of minimizing the width or thickness of the underlying mobile computing devices, a similar trend of minimizing the height of the internal modules has developed out of necessity.

A common implementation of a mobile computing device includes a main printed circuit board (PCB) having one or more processing elements. The distinct lack of internal space due to the smaller form factor not only makes heat dissipation more critical, but also presents additional challenges for heat distribution and dispersal. Moreover, other components (such as camera modules, battery modules, etc.) also generate heat during operation. A popular solution for managing heat levels in mobile computing devices is through the use of performance throttling.

Performance throttling is performed by intentionally limiting or reducing performance levels of components in a system below the highest possible level(s) in order to reduce a heat generated during operation/usage. Typically, a component such as a processor is able to operate at the highest possible rates (e.g., processing frequencies) for a relatively short period. When the heat (as determined by sensors) generated by the processor due to operation exceeds a threshold, operating rates are throttled to reduce the heat produced commensurately. Typically, the threshold at which the performance is throttled corresponds to a higher level of risk with respect to user comfort, or to comply with safe operating limits with respect to the component. However, throttling the performance can negatively impact user experience, since performance levels are reduced, sometimes perceptibly.

To address the throttling issue, recently proposed solutions have incorporated materials with phase changing properties for thermal management. Proposed implementations include heat sink fins interspersed with portions of phase change material, compositions that mix phase change materials with other materials for structural effect, and adhering phase change materials on system-on-chips. However, the proposed solutions each present different issues that may be less than ideal. For example, heat sink fins interspersed with phase change materials would be limited to phase change materials with significantly high melting points, as liquids would not be bound by such a structure, and may leak or otherwise escape from between the heat sink fins. Meanwhile, phase change materials mixed with materials for structural effect (typically graphite or other such compositions) are often mixed with materials that do not exhibit the same thermal properties. Typically, the materials have less ideal thermal properties, such as less heat absorption efficiency. As such, the efficacy of these solutions can be significantly less than solutions where the phase change material is unadulterated. Likewise, adhering phase change materials on system-on-chips would require additional steps, such as encapsulating the phase change materials in molding compounds, that would increase the height of such structures.

SUMMARY OF THE INVENTION

This Summary is provided to introduce a selection of concepts in a simplified form that are further described below in the Detailed Description. This Summary is not intended to identify key features or essential features of the invention, nor is it intended to be used to limit the scope of the invention.

An aspect of the present invention proposes a system for absorbing and managing heat in a computing device using heat management features directly integrated within a support structure or panel. According to these embodiments, a support panel is provided with integrated heat management features as a sheet or block of phase change material (PCM). The heat absorption of the support structure is improved through the integration of the heat management features, since the features will typically have significantly higher latent heat capacitance than the composition of the underlying frame/support structure.

According to another aspect of the present invention, a mobile consumer electronics device—such as a mobile phone, wearable computing device, or tablet—is provided with a mid-frame panel that provides structural and mechanical support to the device while also absorbing heat produced by neighboring components in the computing device to achieve a more even temperature profile. According to these embodiments, heat produced during the operation of the processing components in the computing device is absorbed by heat management features integrated within the mid-frame. In an embodiment, the heat management features include a structure (e.g., a sheet or block) of a solid-liquid phase change material. The phase change material absorbs the heat produced by the processing components. When the heat exceeds the melting point of the phase change material, the phase change material melts to absorb additional heat, keeping the processing components isothermal or nearly isothermal. The phase change material solidifies when operation of the processing components is discontinued and the temperature in the system cools. Through the integration of the phase change material(s), systems with internal performance throttling mechanisms to reduce heat production may delay performance throttling, allowing longer periods of high performance usage.

According to yet another aspect, a support panel is described herein with integrated thermal management features that include phase change materials. In an embodiment, the support panel is implemented to include a metal frame with the thermal management features fully integrated with the panel as a single discrete and contiguous unit. Changes in phase (e.g., solid to liquid) of the thermal management features are contained within the metal frame.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Reference will now be made in detail to the preferred embodiments of the invention, a method and system for the use of a reputation service provider, examples of which are illustrated in the accompanying drawings. While the invention will be described in conjunction with the preferred embodiments, it will be understood that they are not intended to be limit to these embodiments. On the contrary, the invention is intended to cover alternatives, modifications and equivalents, which may be included within the spirit and scope as defined by the appended claims.

Furthermore, in the following detailed descriptions of embodiments of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Embodiments of the invention are directed to solutions for delaying performance throttling in computing devices by using heat management features integrated with a mid-frame support panel. By fully integrating the heat management features within the support panel, performance throttling due to excessive heat may be delayed by maintaining isothermal conditions in mobile computing devices for longer durations.

Integrated Phase Changing Materials

Figure 1:
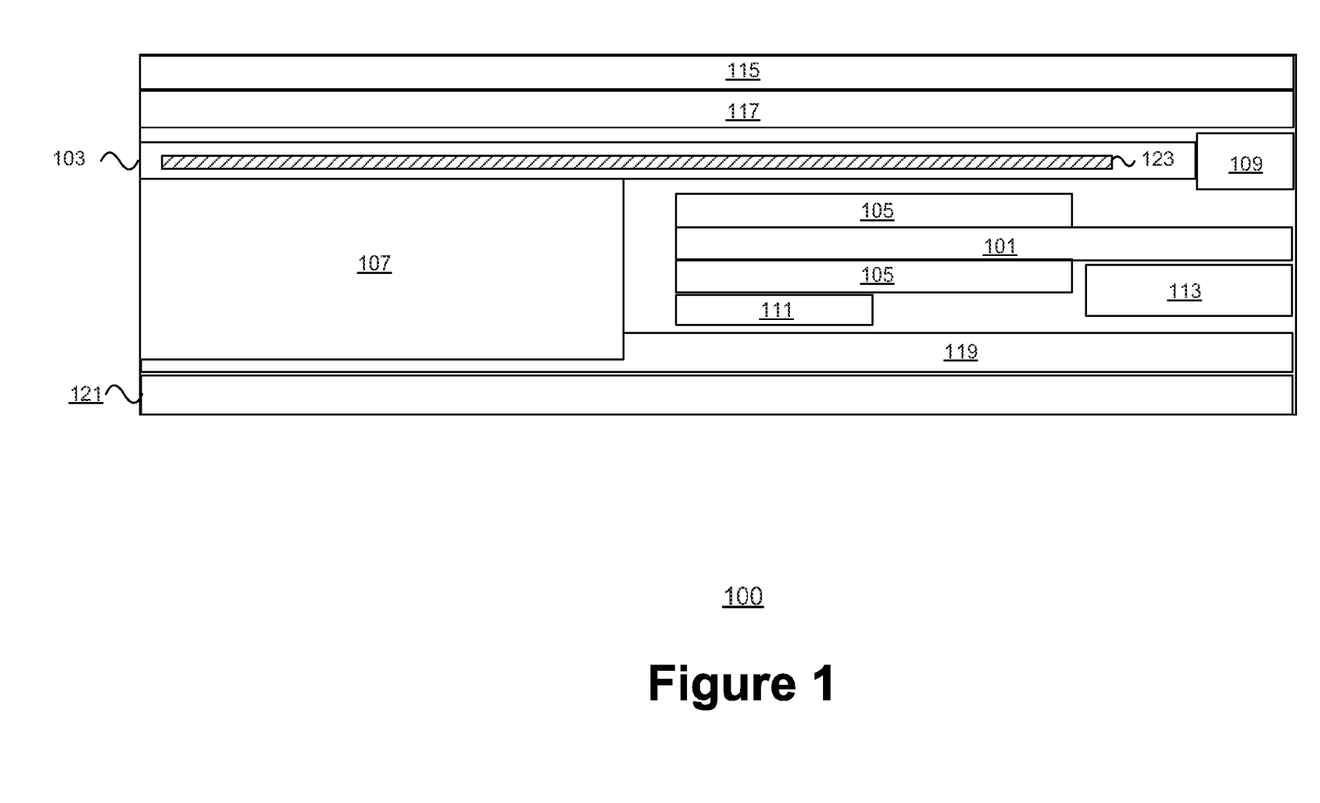
FIG. 1 depicts a first exemplary component layer stack of a mobile computing device, in accordance with various embodiments of the present invention.

FIG. 1 represents a profile of a first exemplary component layer stack 100 in a mobile computing device, according to embodiments of the invention. The mobile computing device may be implemented as, for example, a mobile phone, a tablet device, a netbook, a laptop device, a video game console, a personal data assistant, a media player, a wearable computing device, or any computing system or mobile computing device where heat is a concern, heat management is an interest, and/or a slimmer profile may be desirable. As depicted in FIG. 1, a component layer stack 100 includes a main printed circuit board (PCB) 101 that houses various components that collectively perform a significant portion (if not all) of the processing and rendering in the computing device. These components may include processors, including but not limited to: one or more central processing units (CPUs), one or more graphics processing units (GPUs), one or more application processors (APs, and one or more special purpose processors. According to further embodiments, these components may also include memory devices (flash memory, RAM) and power amplification devices.

According to one or more embodiments, the PCB 101 may be centrally positioned (with respect to height or thickness) within the component layer stack 100, between a front panel (collectively including, for example, a sensor array layer 115 and display panel 117), and a back panel (collective including, for example, a back cover 119 and a battery cover 121). The sensor array layer 115 may also include a camera module consisting of one or more camera lens and shutter devices. Sensor array layer 115 may also comprise a two dimensional array of one or more sensor devices configured to detect touch gestures and contact. In one or more embodiments, the display panel 117 may be implemented as a liquid crystal display (LCD), for example. Component layer stack 100 may also include a rechargeable power source such as a battery 107, positioned on or near the same vertical plane as the PCB, i.e., likewise positioned between the front and back panels.

According to some embodiments, the component layer stack 100 may include one or more shield layers 105 configured to shield, obstruct, or block radio waves from reaching the components of the PCB 101. Other components of the computer layer stack 100 may include a second, alternate, or supplementary "flex" PCB 109 for additional processing, rendering, or memory storage, a speaker module 113, and a subscriber identity module (SIM) card reader 111 used for identification of subscribers in certain cellular data networks.

As depicted in FIG. 1, a component layer stack 100 also includes a mid-frame 103 that provides mechanical and structural support for the component layer stack 100. Mid-frame 103 may be implemented as, for example, a metal frame consisting of a rigid metal or metallic alloy material. According to embodiments of the invention, one or more heat management structures 123 are intrinsically integrated within the mid-frame 103. The heat management structures 123 may be implemented as, for example, one or more structures of a phase change material (PCM) that are operable to absorb heat produced by proximate processing components (of the PCB 101 for example).

In one or more further embodiments, the heat management structures 123 may also include one or more heat spreaders that work with the phase change material to more evenly distribute the absorbed heat and to eliminate hot spots. In one or more embodiments, the heat spreader can be comprised of graphite or other such material with relatively high thermal conductivity. In one or more embodiments, the one or more heat spreaders may be positioned within the mid-frame 103, next to the phase change material, for example. In one or more alternate embodiments, the one or more heat spreaders may be affixed to the mid-frame 103 and between the mid-frame 103 and the processing components of the PCB 101.

In one or more embodiments, the heat management structures 123 are entirely integrated within the mid-frame 103 such that no portion of the heat management structures 123 extends or protrudes beyond the dimensions of the mid-frame structure 103, thereby providing heat management capability without compromising the profile of the mobile computing device. In further embodiments, the heat management structures 123 may be implemented from phase change materials such as: solid-liquid phase change materials, liquid-vapor phase change materials; and crystalline to amorphous structure phase change materials. According to one or more embodiments, the latent heat capacity of the PCM is substantially high. Other desirable qualities exhibited by a PCM according to embodiments of the invention include high thermal conductivity, low thermal expansion, and high specific heat. According to these embodiments, via the integration of the phase change materials, the supporting mid-frame 103 allows adjacent components (such as the PCB 101) to remain isothermal or substantially isothermal, through the phase change of the PCM (e.g., melting of the solid-liquid PCM, vaporization of the liquid-vapor PCM, and liquefying of the crystalline to amorphous structure PCM).

In one or more embodiments, firmware executing in various components of the component layer stack 100 are configured to throttle the performance of the corresponding component when heat produced during operation of a mobile computing device comprising the component layer stack 100 exceeds a pre-determined threshold. Components performing at higher levels naturally produce higher temperatures, and may be reduced or capped at a performance level below the highest performance level possible when the generated heat threshold is reached or exceeded. A threshold may correspond, for example, to a temperature at which the palpable heat emanating from the device becomes noticeable and/or uncomfortable for a user of the device. An alternate threshold may correspond to the upper range of safe operating limits corresponding to the particular component (e.g., as provided by the component's manufacturer).

Through the integration of the phase change materials within the mid-frame, the heat produced during operation can be absorbed for a portion (or entirety, depending on use) of the device's operation, with throttling of the performance being delayed or eliminated entirely. This allows the mobile computing device to maintain high performance levels longer than conventional implementations while maintaining the same vertical profile as just the frame itself. Other advantages include a shorter thermal transfer path from the PCB to the mid-frame by eliminating the thermal resistance of the solder or thermal adhesive. An additional benefit to such an implementation can be realized during assembly and testing since the risk of the heat management structures being peeled or scraped off during assembly, testing, and/or real application can be avoided.

Figure 2:
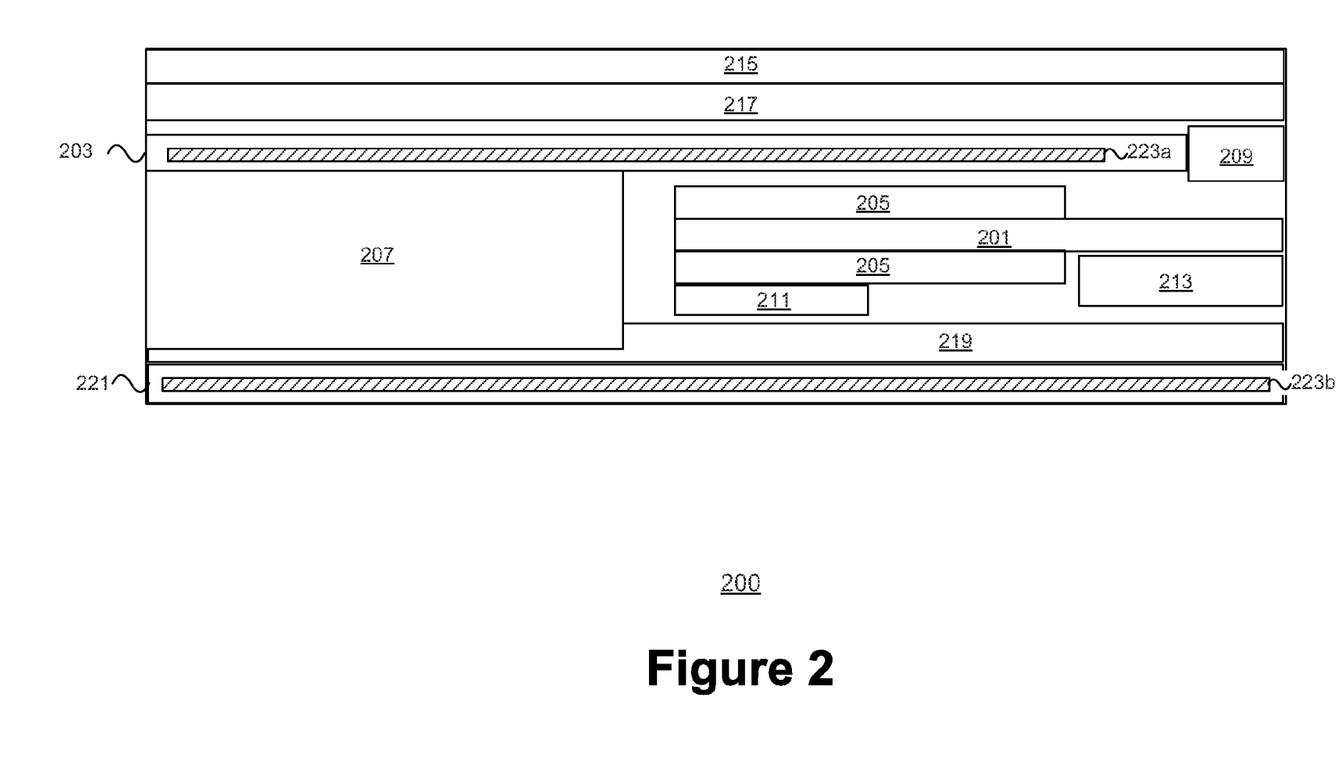
FIG. 2 depicts a second exemplary component layer stack of a mobile computing device, in accordance with various embodiments of the present invention.

FIG. 2 depicts a second exemplary component layer stack 200 of a mobile computing device, in accordance with various embodiments of the present invention. As depicted in FIG. 2, the second exemplary component layer stack 200 also includes a PCB 201, a front panel (collectively including, for example, a sensor array layer 215 and display panel 217); a back panel (collective including, for example, a back cover 219 and a battery cover 221); a rechargeable power source such as a battery 207; and one or more shield layers 205. Other components of the computer layer stack 200 may include a second, alternate, or supplementary "flex" PCB 209, a speaker module 213, and a subscriber identity module (SIM) card reader 211. As depicted in FIG. 2, a component layer stack 200 also includes a mid-frame 203 and one or more heat management structures 223a are intrinsically integrated within the mid-frame 203. In an embodiment, each of the elements 201-223 is similar to like numbered elements (e.g., 101-123) described above with respect to FIG. 1.

In one or more embodiments, a component layer stack 200 also includes heat management structures 223b integrated in the battery cover 221. According to such embodiments, heat produced during the operation of the battery 207 is absorbed by the heat management structures 223b such that the battery 207 may remain isothermal or substantially isothermal. The heat management structures 223b may be implemented as, for example, one or more structures of a phase change material (PCM), such as one or more sheets, slabs, or blocks. In an alternate embodiment, heat management structures 223b may be used in lieu of, rather than in addition to, heat management structures 223a within the mid-frame 203.

Figure 3:
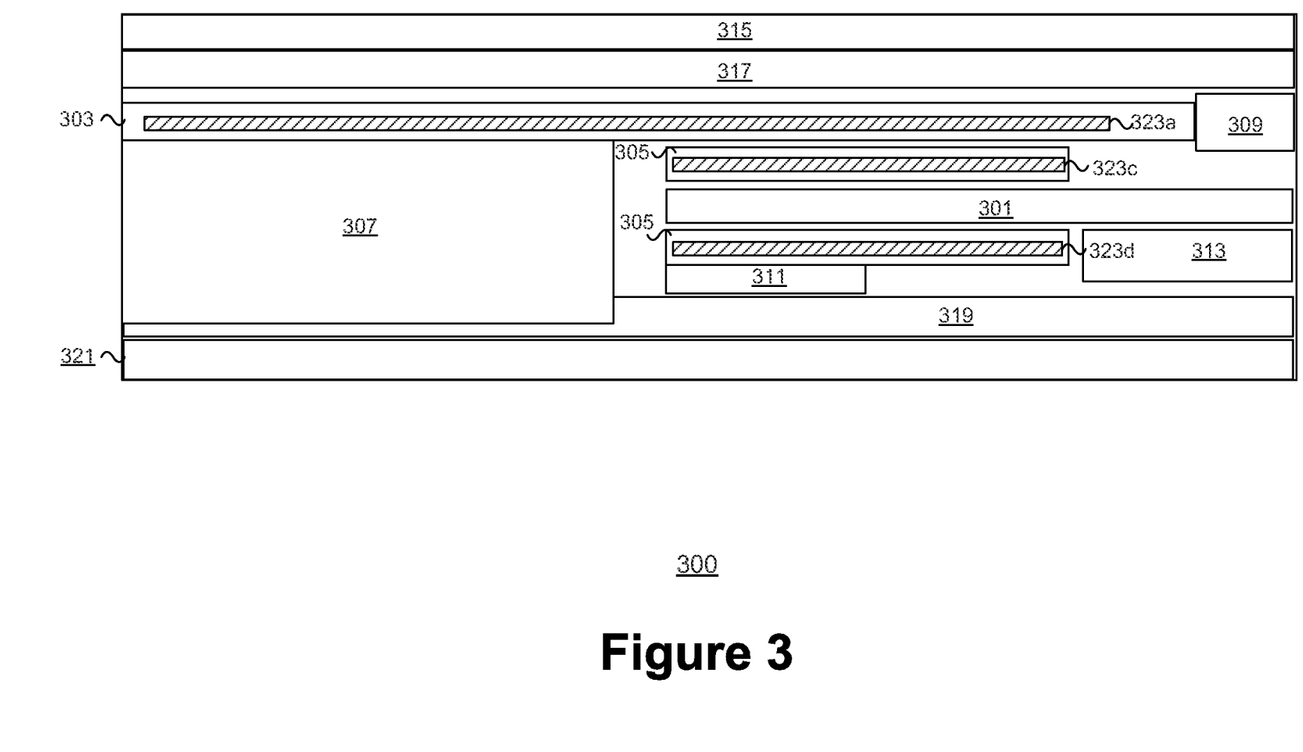
FIG. 3 depicts a third exemplary component layer stack of a mobile computing device, in accordance with various embodiments of the present invention.

FIG. 3 depicts a third exemplary component layer stack 300 of a mobile computing device, in accordance with various embodiments of the present invention. As depicted in FIG. 3, the third exemplary component layer stack 300 also includes a PCB 301, a front panel (collectively including, for example, a sensor array layer 315 and display panel 317); a back panel (collective including, for example, a back cover 319 and a battery cover 321); a rechargeable power source such as a battery 307; and one or more shield layers 305. Other components of the computer layer stack 300 may include a second, alternate, or supplementary "flex" PCB 309, a speaker module 313, and a subscriber identity module (SIM) card reader 311. As depicted in FIG. 3, a component layer stack 300 also includes a mid-frame 303, with one or more heat management structures 323a intrinsically integrated within the mid-frame 303. In an embodiment, each of the elements 301-323a is similar to like numbered elements (e.g., 101-123) described above with respect to FIG. 1.

In one or more embodiments, a component layer stack 300 also includes heat management structures 323c and 323d integrated in the shield layers 305. According to such embodiments, heat produced during the operation of the mobile computing unit is absorbed by the heat management structures 323c, 323d such that adjacent components (such as the PCB 301) may remain isothermal or substantially isothermal. The heat management structures 323c, 323d may be implemented as, for example, one or more structures of a phase change material (PCM), such as one or more sheets, slabs, or blocks. In an alternate embodiment, heat management structures 323c and 323d may be used in lieu of, rather than in addition to, heat management structures 323a within the mid-frame 303.

Figure 4:
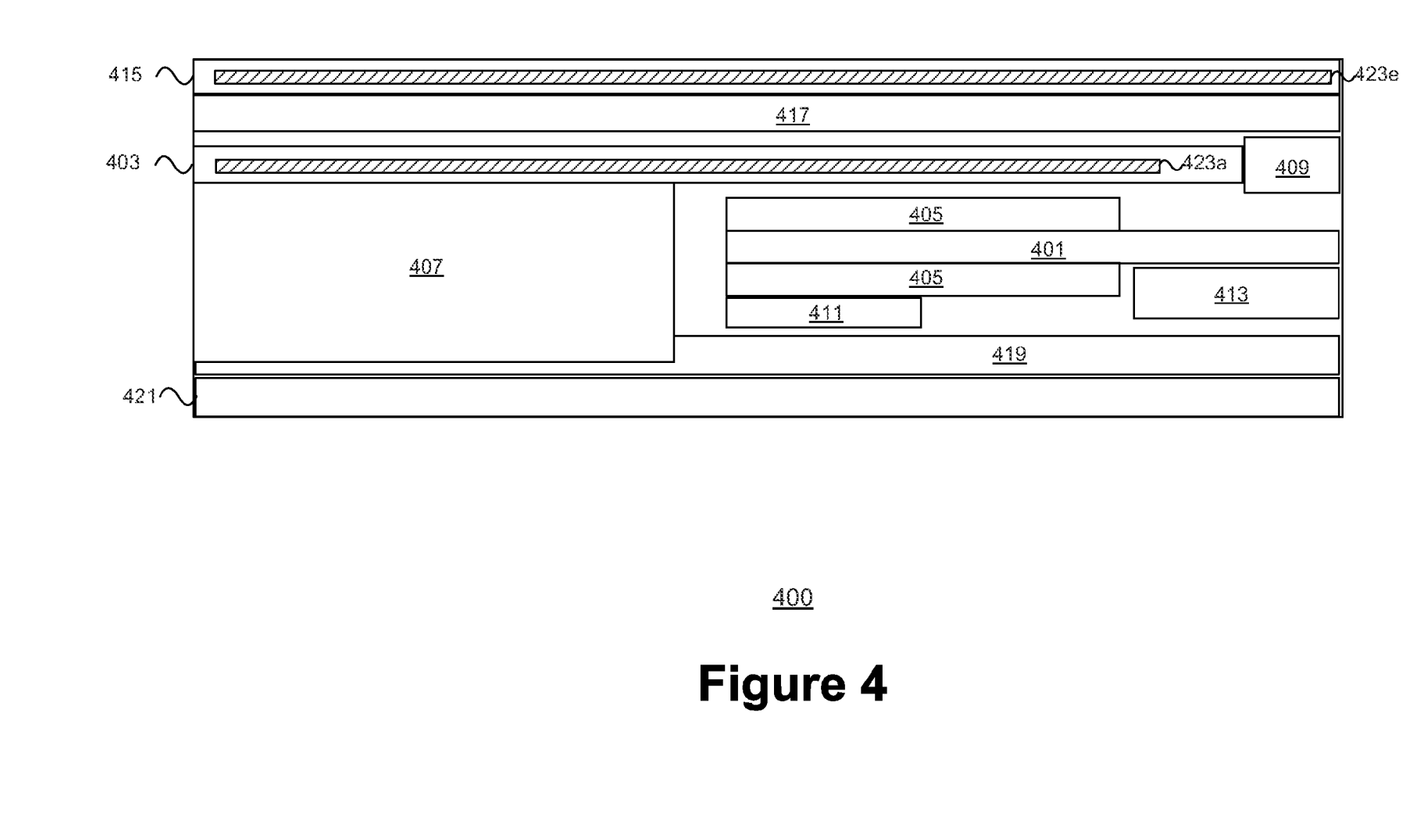
FIG. 4 depicts a fourth exemplary component layer stack of a mobile computing device, in accordance with various embodiments of the present invention.

FIG. 4 depicts a fourth exemplary component layer stack of a mobile computing device, in accordance with various embodiments of the present invention. As depicted in FIG. 4, the fourth exemplary component layer stack 400 also includes a PCB 401, a front panel (collectively including, for example, a sensor array layer 415 and display panel 417); a back panel (collective including, for example, a back cover 419 and a battery cover 421); a rechargeable power source such as a battery 407; and one or more shield layers 405. Other components of the computer layer stack 400 may include a second, alternate, or supplementary "flex" PCB 409, a speaker module 413, and a subscriber identity module (SIM) card reader 411. As depicted in FIG. 4, a component layer stack 400 also includes a mid-frame 403, with one or more heat management structures 423a intrinsically integrated within the mid-frame 403. In an embodiment, each of the elements 401-423a is similar to like numbered elements (e.g., 101-123) described above with respect to FIG. 1.

In one or more embodiments, a component layer stack 400 also includes heat management structures 423e integrated in the front panel (specifically, the camera module in the sensor array layer 415). In one or more further embodiments, the camera module in the sensor array layer 415 includes one or more light-emitting diodes (LED) devices for generating flashes of light (e.g., during flash photography for example). Other LED devices may be used to provide a backlight for the display layer 417. According to such embodiments, heat produced during the operation of the mobile computing unit (camera module and/or display) is absorbed by the heat management structures 423e such that adjacent components (such as the sensor array layer 415 and display panel 417) may remain isothermal or substantially isothermal. The heat management structures 423e may be implemented as, for example, one or more structures of a phase change material (PCM), such as one or more sheets, slabs, or blocks. In an alternate embodiment, heat management structures 423e may be used in lieu of, rather than in addition to, heat management structures 423a within the mid-frame 403.

Figure 5:
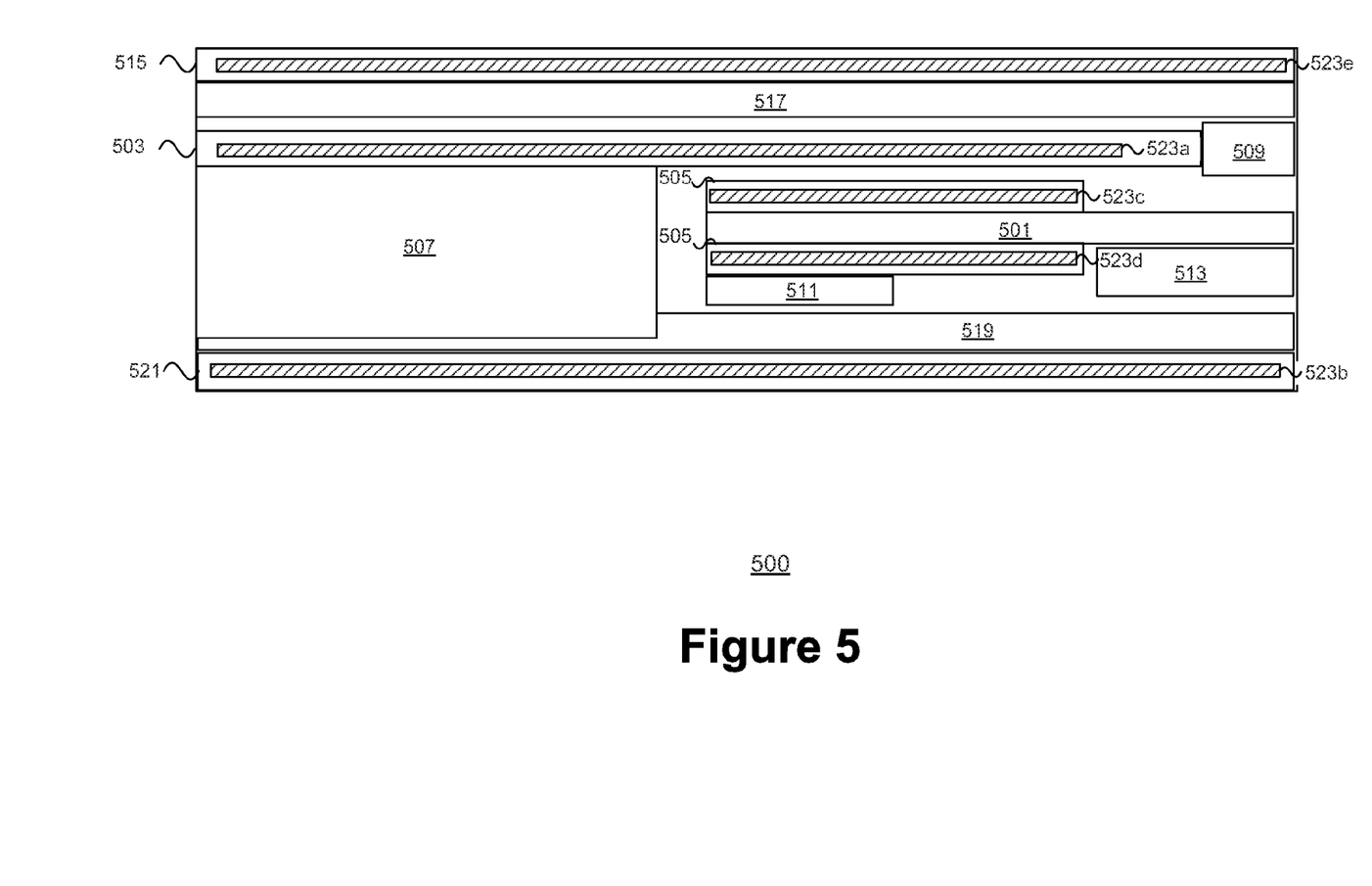
FIG. 5 depicts a fifth exemplary component layer stack of a mobile computing device, in accordance with various embodiments of the present invention.
Figure 6:
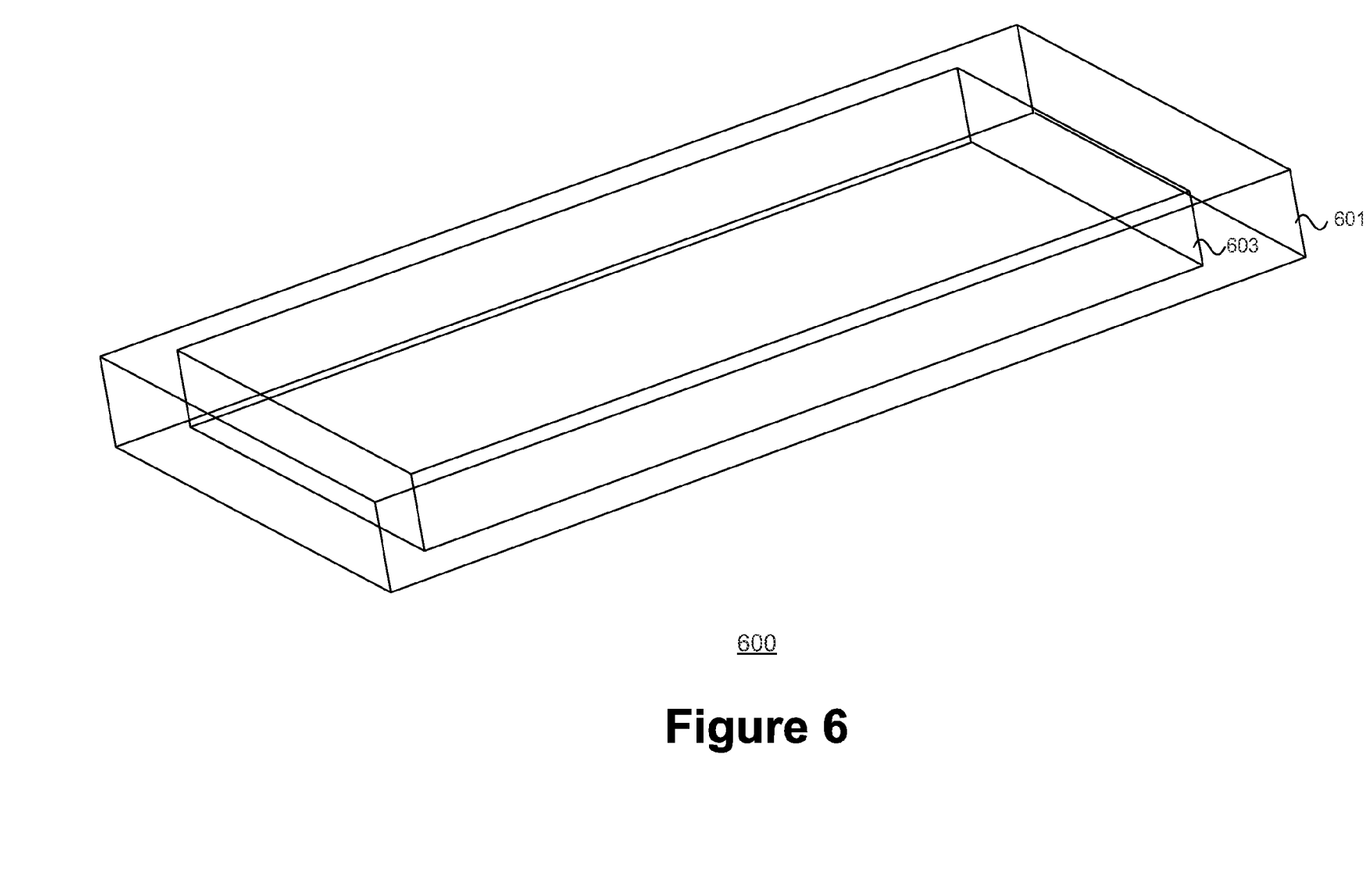
FIG. 6 depicts a three-dimensional view of an exemplary mid-frame of a mobile computing device with integrated heat management features, in accordance with various embodiments of the present invention.

FIG. 5 depicts a fifth exemplary component layer stack of a mobile computing device, in accordance with various embodiments of the present invention. As depicted in FIG. 5, the fifth exemplary component layer stack 500 also includes a PCB 501, a front panel (collectively including, for example, a sensor array layer 515 and display panel 517); a back panel (collective including, for example, a back cover 519 and a battery cover 521); a rechargeable power source such as a battery 507; and one or more shield layers 505. Other components of the computer layer stack 500 may include a second, alternate, or supplementary "flex" PCB 509, a speaker module 513, a subscriber identity module (SIM) card reader 511; and a mid-frame 503. As depicted in FIG. 5, one or more heat management structures 523a, 523b, 523c, 523d, and 523e are intrinsically integrated within the mid-frame 503, battery cover 521, front panel (including sensor array/camera module 515), and shielding layers 505, respectively. In an embodiment, each of the elements 501-523a is similar to like numbered elements (e.g., 101-123) described above with respect to FIG. 1. Element 523b is similar to like numbered elements (e.g., 223b) described above with respect to FIG. 2. Elements 523c and 523d are similar to like numbered elements FIG. 6 depicts a three-dimensional view 600 of an exemplary mid-frame 601 in a mobile computing device with integrated heat management features 603, in accordance with various embodiments of the present invention. As depicted in FIG. 6, the integrated heat management features 603 consists of a structure (such as a sheet, slab, or block) of phase change material encased entirely internally with respect to the mid-frame 601. While depicted in such a configuration, it is to be understood that the integrated heat management features are well suited to varying other compositions. For example, alternate embodiments may be implemented as a chamber with liquid to vapor phase change materials, or a structure of crystalline to amorphous structure phase changing materials.

Figure 7:
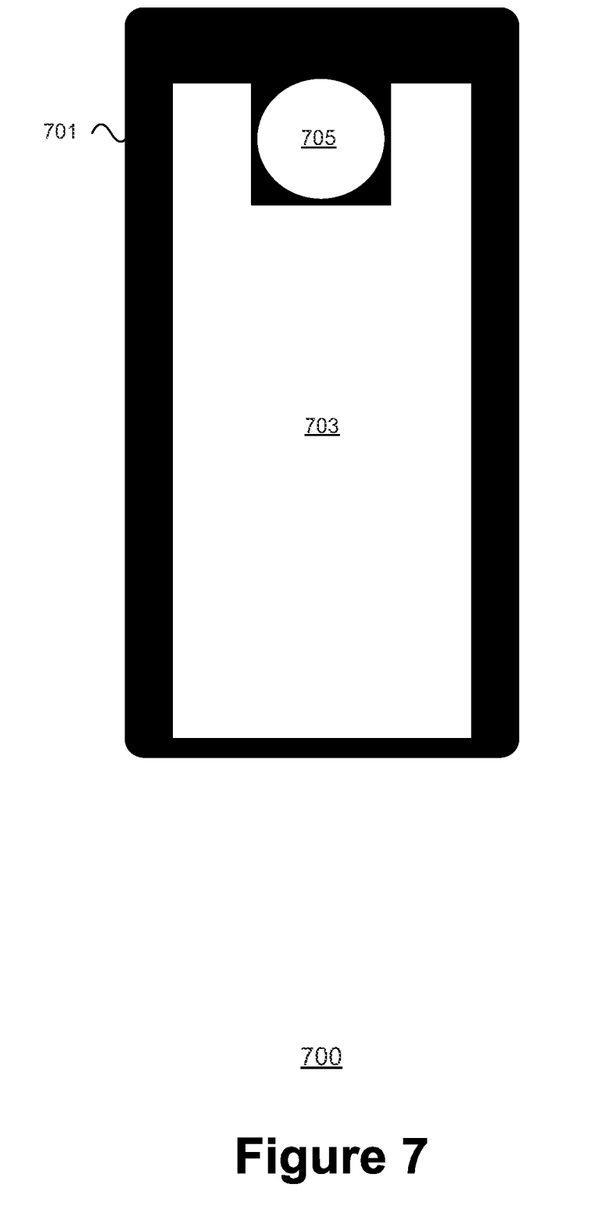
FIG. 7 depicts an exemplary back panel of a mobile computing device with integrated heat management features, in accordance with various embodiments of the present invention.

FIG. 7 depicts a block diagram 700 of an exemplary back panel 701 of a mobile computing device. As depicted in FIG. 7, the back panel 701 may have an integrated structure of thermal phase change material 703. As discussed in the foregoing descriptions, the structure may consist of a sheet, slab, block or other generally flat arrangement sufficient to fit entirely within the dimensions of the back panel 701. As depicted in FIG. 7, back Panel 701 may include an aperture 705 for a camera module, according to various embodiments.

Figure 8:
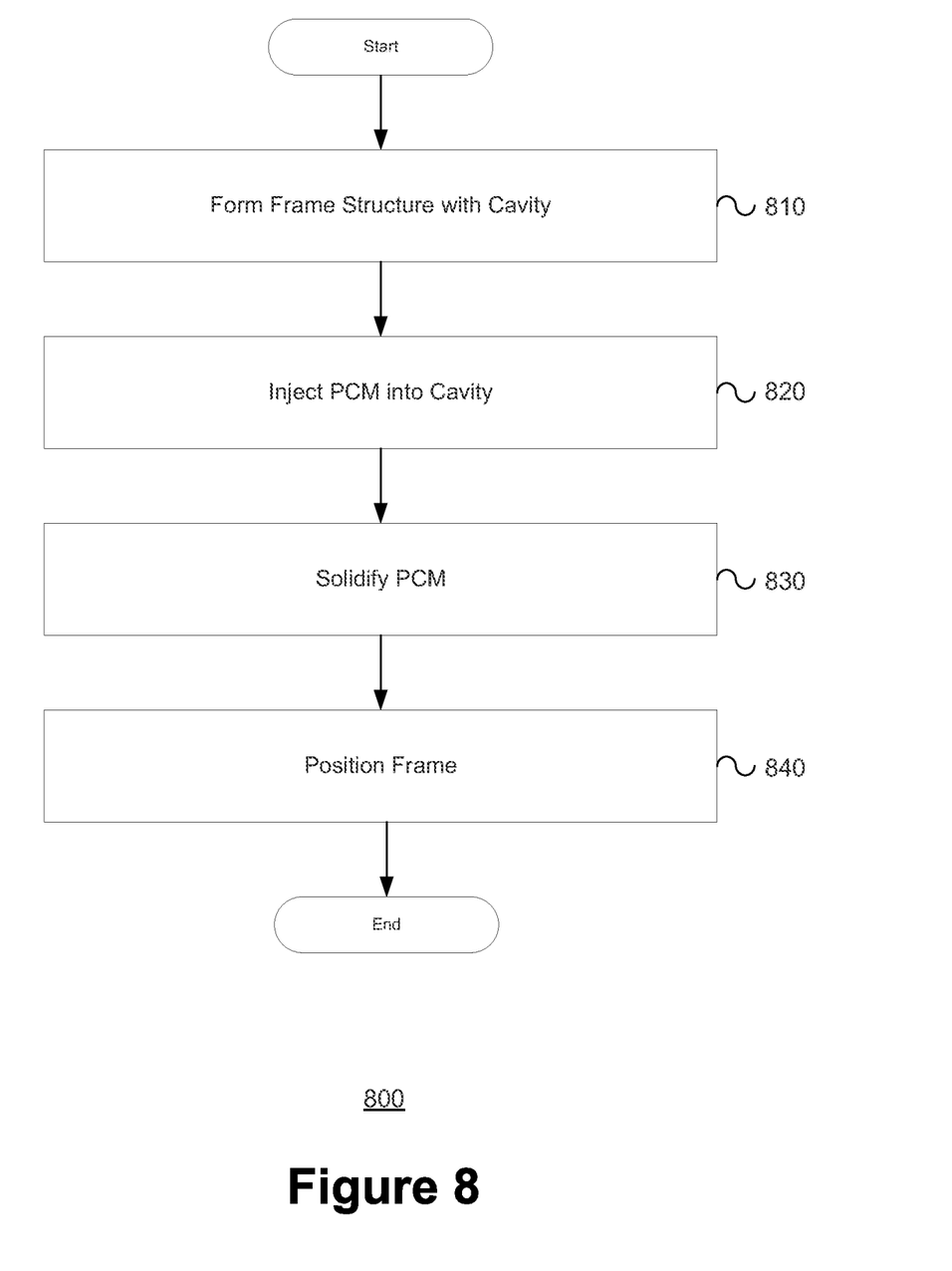
FIG. 8 depicts a flowchart for manufacturing a mobile computing device with integrated heat management features, in accordance with various embodiments of the present invention.

FIG. 8 depicts a flowchart 800 of dissipating heat using heat management structures integrated within a mid-frame of a mobile computing device, in accordance with various embodiments of the present invention. Steps 810-850 describe exemplary steps of the flowchart 800 in accordance with the various embodiments herein described.

In one or more embodiments, a frame structure is formed at step 810. In an embodiment, the frame structure may comprise a mechanical support structure, such as a mid-frame, and may be composed of a metal, such as aluminum. According to alternate embodiments, the frame structure may be implemented as a shield layer, a battery cover, or a front panel (including, in some embodiments, a sensor array and/or camera module). In an embodiment, the frame structure may be formed as a hollow shell with a cavity. At step 820, heat management structures are integrated into the cavity of frame structure. In an embodiment, the heat management structures may be implemented as a sheet (or similar physical structure) of one or more phase change materials (PCMs). As described above, the PCMs may include, but are not limited to, solid-liquid PCMs, liquid-vapor PCMs, and crystalline-amorphous structure PCMs. Integrating may be performed by injecting (in liquid, amorphous, or vapor form) the corresponding PCM into the cavity of the frame structure formed in step 810. At 830, the PCM either solidifies (from a liquid), liquefies (from a vapor), or crystallizes (from an amorphous structure). The frame structure with the integrated heat management structures is then positioned at step 840 within the mobile computing device. Proper positioning depends on the particular purpose of the frame structure. A frame structure such as a mid-frame for example, may be disposed over a printed circuit board (PCB), or both a PCB and a battery. Likewise, a frame structure implemented as a battery cover may have at least a portion of the battery cover disposed in contact with a surface of a battery. Other frame structures may be positioned immediately next to the particular component(s) for which heat regulation is desirable.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A mobile computing device, comprising:
    a front panel;
    a back panel;
    a plurality of components arranged in a component layer stack, the component layer stack including a printed circuit board and at least one processor;
    a monolithic mid-frame disposed between the front panel and the back panel, wherein the mid-frame includes a closed cavity, the closed cavity being filled with a first phase change material, and wherein the mid-frame is configured to provide mechanical support for the component layer stack of the mobile computing device between the front panel and the back panel and to absorb heat produced by the plurality of components.

2. The mobile computing device according to claim 1, wherein at least one component of the plurality of components is configured to throttle a performance of the at least one component when heat produced by the at least one component exceeds a threshold.

3. The mobile computing device according to claim 2, wherein the first phase change material substantially delays a throttling of the performance of the at least one component by absorbing the heat produced by the at least one component.

4. The mobile computing device of claim 3, wherein the first phase change material comprises a structure of phase change material.

5. The mobile computing device of claim 1, wherein the first phase change material comprises at least one of:
    a solid-liquid phase change material;
    a liquid-vapor phase change material; or
    a crystalline to amorphous structure phase change material.

6. The mobile computing device of claim 5, wherein the first phase change material has a state change point that corresponds to an initial increase in a temperature of at least one component of the plurality of components.

7. The mobile computing device of claim 5, wherein the first phase change material is configured to change a current state of the first phase change material when the heat produced by the plurality of components and absorbed by the first phase change material exceeds a state change point of the first phase change material.

8. The mobile computing device of claim 1, wherein the first phase change material has a higher latent heat capacitance than a material comprising the mid-frame.

9. The mobile computing device of claim 1, wherein at least one component of the plurality of components includes firmware executing in the mobile computing device, and wherein the firmware is configured to throttle a performance of the at least one component when heat produced by the at least one component exceeds a threshold.

10. The mobile computing device of claim 1, wherein the mid-frame comprises a metal frame.

11. The mobile computing device of claim 1, further comprising a heat spreader proximately positioned with respect to the first phase change material, the heat spreader being configured to evenly distribute the heat across the first phase change material.

12. The mobile computing device of claim 1, wherein the first phase change material is configured to absorb heat generated by a component included in the plurality of components of the mobile computing device, the component being positioned proximate to the mid-frame.

13. The mobile computing device of claim 12, wherein a firmware corresponding to the component is configured to throttle a performance level of the component when the heat generated by the component exceeds a threshold.

14. The mobile computing device of claim 13, wherein the first phase change material is configured to delay a throttling of the performance level of the component due to generation of the heat by the component.

15. The mobile computing device of claim 12, wherein the first phase change material has a melting point that corresponds to an initial increase in a temperature of the component.

16. The mobile computing device of claim 1, further comprising:
    a rechargeable power source comprised in the mobile computing device and configured to provide power for the mobile computing device;
    a rechargeable power source cover comprised in the mobile computing device and configured to provide mechanical support for the rechargeable power source; and
    a second phase change material integrated into the rechargeable power source cover and configured to absorb heat produced by the rechargeable power source.

17. The mobile computing device of claim 1, further comprising:
    the printed circuit board (PCB) arranged between the front and back panels;
    a shielding layer positioned adjacent to the PCB and between the PCB and one of the front panel or back panel, wherein the shielding layer includes a second phase change material integrated monolithically with the shielding layer and configured to absorb heat produced by the PCB.

18. The mobile computing device of claim 1, further comprising:
    a camera module comprising a light-emitting diode (LED) device, the camera module being disposed in the front panel; and
    a second phase change material integrated into the front panel and configured to absorb heat produced by the camera module.

* * * * *